United States Patent [19]
Cripe et al.

[11] Patent Number: 5,703,482
[45] Date of Patent: Dec. 30, 1997

[54] APPARATUS FOR TESTING ELECTRONIC DEVICES IN HOSTILE MEDIA

[75] Inventors: Jerry D. Cripe, Tempe; Theresa Ann Maudie; Charles L. Reed, both of Phoenix; Michael P. Menchio, Mesa, all of Ariz.

[73] Assignee: Motorola, Inc., Schaumburg, Ill.

[21] Appl. No.: 283,435

[22] Filed: Aug. 1, 1994

[51] Int. Cl.$^6$ .................................................. G01R 31/26
[52] U.S. Cl. ......................................... 324/158.1; 324/760
[58] Field of Search .............................. 324/158.1, 73.1, 324/760, 765, 755, 757; 209/219; 165/80.3, 80.4, 104.13

[56] References Cited

U.S. PATENT DOCUMENTS

| | | | |
|---|---|---|---|
| 3,710,251 | 1/1973 | Hagge et al. | 324/760 |
| 4,741,385 | 5/1988 | Bergles et al. | 324/158.1 |
| 4,745,354 | 5/1988 | Fraser | 324/765 |
| 5,004,973 | 4/1991 | Taraci et al. | 324/760 |
| 5,084,671 | 1/1992 | Miyata et al. | 324/760 |
| 5,187,432 | 2/1993 | Bauernfeind et al. | 324/760 |

*Primary Examiner*—Vinh P. Nguyen
*Attorney, Agent, or Firm*—Aaron B. Bernstein; George C. Chen

[57] ABSTRACT

An apparatus for testing electronic devices in hostile media includes an isolation tank (24) which contains an inert or relatively inert material (26) such as fluorinated hydrocarbon liquid. Within the isolation tank (24) submersed in the inert or relatively inert material (26), is at least one test chamber (12) containing hostile and/or volatile test medium (14) such as a fuel mixture. Adjacent to the test chamber (12) and also within isolation tank (24) is a loading chamber (30) via which electronic devices to be tested are coupled to the test tank (12). The loading chamber (30), test tank (12) and isolation tank (24) are all isolated from the ambient environment and are oxygen free because they each contain a gas purge lines (33,35,38) providing an inert or relatively inert gas to a positive pressure within the respective tanks and chamber. The electronic devices (16) are electrically connected through a lid over the loading chamber (30) to computer control equipment (50) which provides for functional in situ testing.

19 Claims, 2 Drawing Sheets

APPARATUS FOR TESTING ELECTRONIC DEVICES IN HOSTILE MEDIA

The present invention relates to test systems, and more particularly, to test systems for testing electronic devices in hostile media.

BACKGROUND OF THE INVENTION

There is a present and emerging market for devices such as electronic sensors which are designed to be used in hostile or harsh media applications. For example, in the automotive industry, electronic devices such as sensors are exposed to various gasoline and fuel mixtures, corrosives, solvent based fluids such as brake fluids, and the like. The present state of the art for testing sensors and other electronic devices in such harsh or hostile media has been inadequate for proof of design, qualification testing and production testing of devices.

More particularly, in the past, tests of electronic devices in hostile media have been performed in Parr pressure vessels or similar apparatus. The drawbacks to such a test configuration is that only total immersion of the device may be performed, and no active device (in situ) functional testing could be performed. Furthermore, such conventional testing was not particularly safe in that extremely volatile test media was not particularly well isolated from the ambient atmosphere or from hazards such as sparks, etc. Consequently, conventional test methods of sensors or other electronic devices in hostile media are unsafe, do not provide in situ monitoring, provide only full immersion testing, and a sealed pressure vessel (e.g. a Parr vessel) experiences a pressure rise as temperature increases.

The commercial market for electronic devices such as sensors which must operate in hostile media is steadily and rapidly increasing. Typical devices for which there is a growing demand include fuel vapor sensors, fuel rail sensors and harsh water sensors. It is estimated that the hostile media sensor market will soon become greater than 90 percent of the total sensor demand.

Although there is a particularly strong need for a test system for testing electronic sensors in hostile media, there is similarly a need for such a test system which can be applied to electronic devices in the more general sense. For example, there are applications where analog and/or digital semiconductor devices, circuit boards, and related components must be exposed to hostile media. Consequently, what is needed is an apparatus for testing electronic devices in hostile media which allows for full functional in situ monitoring and is safe enough to be located in conventional work environments.

DETAILED DESCRIPTION OF THE DRAWINGS

Generally speaking, the present invention relates to an apparatus for testing electronic devices in hostile media. The hostile media may comprise liquid, vapor, or gas, or a combination thereof. The apparatus includes an isolation tank which contains an inert material such as a fluorinated hydrocarbon liquid blanketed with an inert or relatively inert gas. Within the isolation tank, submersed in the inert material, is at least one test chamber containing a hostile and/or volatile test medium such as a fuel mixture. Adjacent the test chamber and also within the isolation tank is a loading chamber via which electronic devices to be tested are coupled to the test tank. The loading chamber, test tank and isolation tank are all isolated from the ambient environment and are oxygen free because they each contain a gas purge line providing an inert gas to a positive pressure within the respective tanks and chamber. The electronic devices are electrically connected through a lid over the loading chamber to computer control equipment which provides for fully functional in situ testing.

Throughout this description the term "relatively inert", used in reference to purging gases, is intended to mean gases which displace oxygen and do not support combustion.

Figure 1:
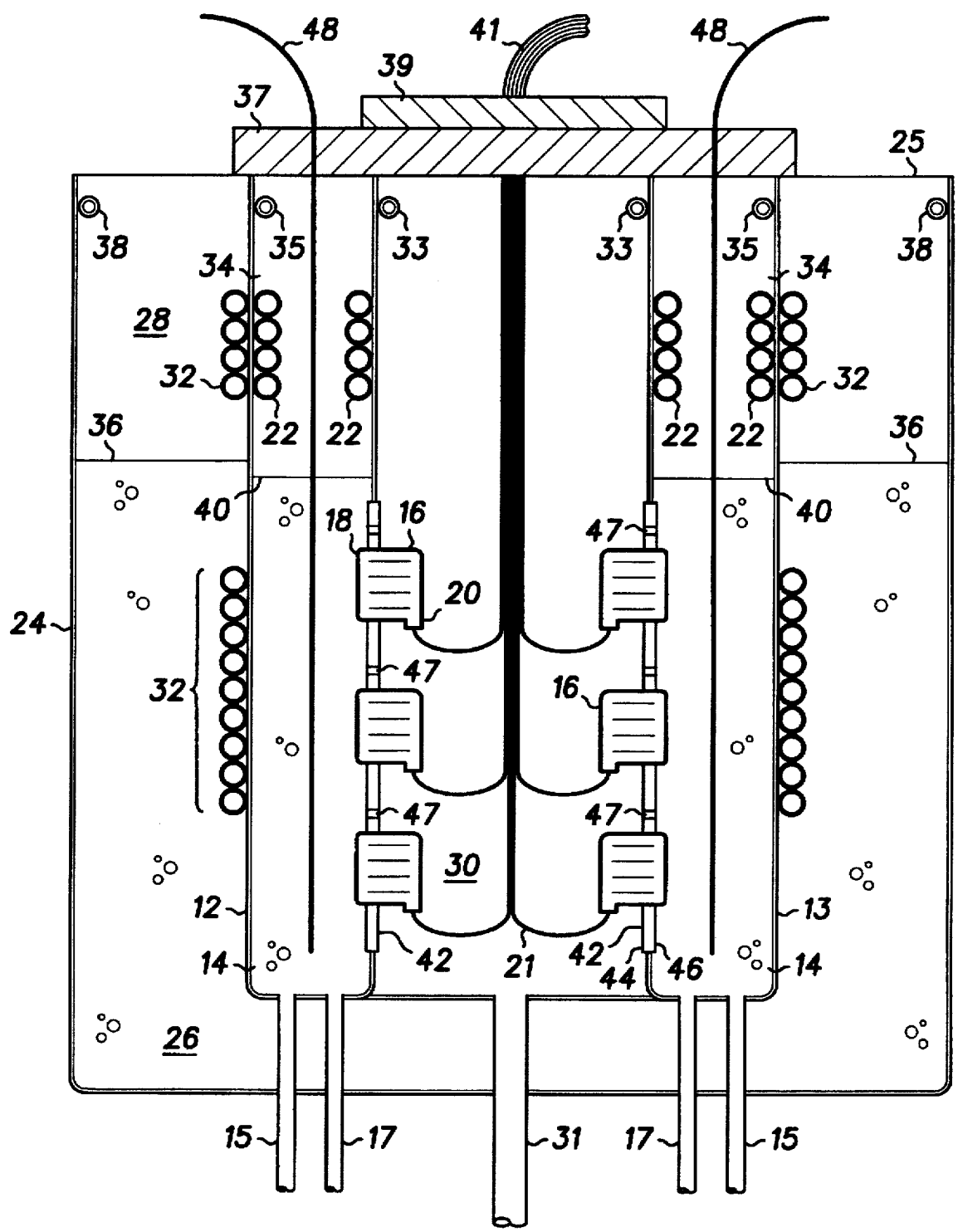
FIG. 1 is a cross-section view representing an apparatus for testing electronic devices in hostile media.

Turning to the figures, a particular embodiment of a test apparatus is shown. Nevertheless, it will be understood that other embodiments and modifications will clearly fall within the scope of the present invention. FIG. 1 is a cross-section side view representing an apparatus 10 for testing electronic devices in hostile media. Test apparatus 10 includes an oxygen free external isolation tank 24. Isolation tank 24 is filled to a first level 36 with an inert material, preferably fluorinated hydrocarbon liquid 26. Overlying fluorinated hydrocarbon liquid 26 within isolation tank 24 is inert gas 28. Preferably, inert gas 28 is nitrogen provided by nitrogen purge lines 38. Isolation tank 24 further comprises isolation tank cooling elements 32; which are preferably circulating coils. Additionally, isolation tank 24 includes isolation tank lid 25.

At least partially contained within isolation tank 24 are oxygen free test tanks 12, 13. Using test tank 12 for descriptive purposes, with the understanding that test tank 13 is similar, test tank 12 comprises test medium 14 filling test tank 12 to a fill level 40. Test tank 12 further comprises reflux system cooling elements 22 as well as an Overlying layer of inert gas 34 provided by inert purge gas lines 35. Cooling elements 22 are typically circulating coils, and gas 34 is typically. nitrogen. Additionally, test tank 12 includes temperature sensor (thermo couple) 48. Furthermore, test tank 12 includes test medium input line 15 leading from a pump providing test medium 14, and test medium output line 17 leading back to the pump for circulating test medium 14.

Adjacent to test tanks 12 and 13 is loading chamber 30 which is oxygen free during processing. Oxygen free loading chamber 30 contains a plurality of electronic sensors 16. The plurality of electronic sensors 16 are mounted in modular test plates 42 such that the sensing portions 18 of the sensors 16 are exposed to test medium 14, while the control portions 20 of sensors 16 are isolated from the test medium. Alternatively, a different modular test plate might be used which is configured such that sensors 16 are completely submersed in test medium 14. Control wiring 21 emanates from the control portion of each of the plurality of sensors 16, being gathered within the test chamber and fed into the loading chamber lid 37. Wires 21 pass through lid 37 to connector portion 39. Connector portion 39 is connected via cables 41 to automated test system equipment and computers (shown in FIG.3).

Returning to the loading chamber, modular test plates 42 include a loading chamber side 44 and a test tank side 46. The plurality of electronic sensors 16 pass through modular test plates 42, emerging from the test tank side 46 to be exposed to the test medium 14. Modular test plates 42 further include fiber optic level sensing ports 47. Additionally, loading chamber 30 includes drain 31.

Referring to the particular embodiment shown in FIG. 1, the test apparatus 10 permits in situ functional testing of fully immersed or vapor saturated sensors over a wide range of temperatures and hostile media. Apparatus 10 includes uniquely isolated and flexible testing chambers 12, 13 for testing sensors 16 in various media 14. Because of the temperature control provided by heaters external to isolation tank 24 (not shown) as well as temperature feedback provided by thermocouples 48, in cooperation with reflux system cooling elements 22, the phase and precise stoichiometry of test medium 14 can be controlled. For example, those with ordinary skill in the art will readily understand that cooling elements 22 can cool test medium 14 vapors to maintain a constant stoichiometry and desired phase of test medium 14.

The system 10 has particular applicability for automobile sensor testing in media such as gasoline or other fuel mixtures, corrosives, solvent based fluids such as brake fluids, or the like. Additionally, corrosive medical fluids and biological/agricultural fluids which require an oxygen free environment can be tested in this apparatus. As will be seen with reference to FIGS. 2 and 3, the system is housed in a solvent station or hood. The preferred system 10 includes two test tanks 12, 13 for testing the sensor devices 16. Sensor devices 16 are mounted through removable modular test plates 42 to allow functional testing. Alternatively, similar sensor devices may be mounted entirely on the media side of a differently configured modular test plate for total immersion in liquid or vapor.

The preferred apparatus 10 provides for test media 14 temperature control from −65° C. to 150° C. The test tanks 12, 13 are heated via heaters external to isolation tank 24 (not shown), through fluorinated hydrocarbon solution 26. Fluorinated hydrocarbon solution 26 provides superior dielectric isolation from external heaters and other equipment so as to isolate test tanks 12, 13 from the ambient atmosphere, sparks, and the like.

Test tanks 12, 13 include cooling elements 22 near the top of the test tanks 12, 13. Cooling elements 22 provide reflux of the vapors of test medium 14 such that a constant stoichiometry of test medium 14 may be maintained during testing. It will be understood that a constant stoichiometry is important for reliable and consistent testing.

Nitrogen purge lines 33, 35, 38 (which are adaptable to provide any relatively inert gas, as defined above) cause the loading chamber 30 testing tank 12, 13 and isolation tank 24, respectively, to be oxygen free and to maintain a positive pressure within the respective tanks and chambers. Lids 25 and 37 are preferably designed to allow excessive pressure to be relieved if necessary.

Level sensing of test medium 14 in test chambers 12, 13 is provided by leak detector fiber optics (not shown) coupled to fiber optic ports 47. Fiber optics allow the level 40 of test medium 14 to be monitored and located at different heights within the test tanks 12, 13. Consequently, tests may be performed where only certain ones of the plurality of sensors 16 are fully immersed, while other ones of the sensors 16 are exposed only to vapors.

As already discussed, test chambers 12, 13 can be heated to a full range of test temperatures via external heaters through isolation tank 24 and inert medium 26. Furthermore, test tanks 12, 13 can be chilled via cooling elements 32 in the case that a low test temperature is desired, or in order to quickly bring down the temperature of a hot system 10 following testing.

Input ports 15 and output ports 17 lead to external test medium pumps and allow for circulation and agitation of test medium 14, which in turn provides a consistent test environment for the plurality of electronic sensors 16. The system additionally includes drain 31 coupled to loading chamber 30 in order to drain any liquids which may enter loading chamber 30.

In view of the above description, it can be seen that apparatus 10 provides an extremely safe and flexible test environment for electronic devices which must be tested while exposed to harsh media. The test devices may be exposed to liquid, vapor or gas, including combinations. The electronic devices may be partially exposed or fully immersed. The test medium along with the exposed portion of the electronic devices may be heated or cooled as desired. The stoichiometry and phase of the test medium may be carefully and accurately controlled.

Furthermore, regarding safety, the electronic devices are mounted through a loading chamber which is purged with an inert gas to a positive pressure and is therefore oxygen free. Additionally, the test chambers are purged with an inert gas to maintain positive pressure and are therefore oxygen free. Furthermore, an isolation tank which contains inert liquid and inert gas at a positive pressure surrounds the test tanks. Consequently, since the entire system is oxygen free, there is no opportunity for combustion anywhere within the system. In addition, the automated controls of the system provides automatic system shut down for: failure of purge gas flows, both total and to specific areas; system exhaust failure; emergency power off condition; heated media at wrong level; interlocks for over temperature and flow through recirculation heater; chilled water temperature and flow interlock; drain temperature interlock; exhaust shield interlock; process lid interlock; key lock control for acid solvent drain select; and current limiting controls of bias on sensor devices while under test.

Figure 2:
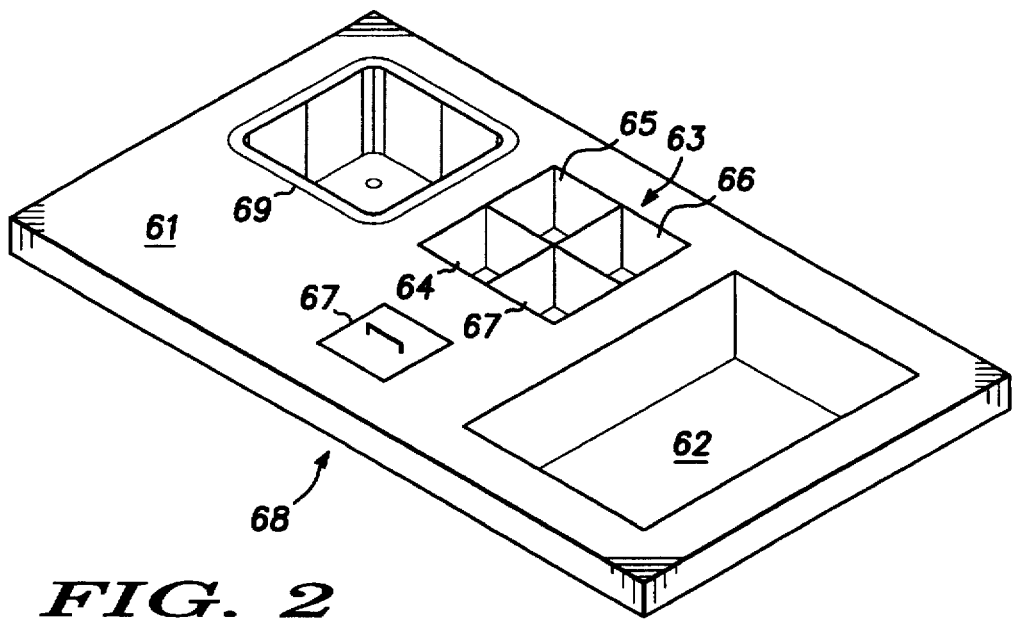
FIG. 2 is a partial perspective view representing a deck lid design for use with the apparatus of FIG. 1.

Turning to FIG. 2, FIG. 2 is a partial perspective view of a solvent hood deck lid 61 design for use with test apparatus 10. Although deck lid 61 is one suitable design for use in association with test apparatus 10, it will be recognized by those skilled in the art that a variety of other environments are equally appropriate. More specifically, test apparatus 10 resides in opening 62 of deck lid 61. Deck lid 61 further includes manifolded bottle feed system 63. Bottle feed system 63 includes openings 64, 65, 66 and 67 for receiving one gallon test medium bottles (bottles not shown). The four bottles may be manifolded together with feed and mixing accomplished by control according to a variety of well-known methods. Preferably, a precision metering pump (not shown) is used for mixing the medium. Additionally, although reflux facilitated by the test tank cooling elements 22 provide constant stoichiometry under certain circumstances, the metering pump can also feed medium to the tank in precise proportions to maintain constant stoichiometry.

Deck lid 61 further includes oxygen free intermediate mixing chamber 68. Chamber 68 resides below deck lid 61. The computer controlled manifold leading from the feed system 63 feeds to chamber 68. Furthermore, dry chemicals, particulates, etc., may be added to chamber 68 in order to conveniently incorporate them into the test medium to be fed into the test tanks. Consequently, manifolded feed system 63 in combination with intermediate mixing chamber 68 provide a particularly convenient system for mixing and feeding very accurately controlled test medium to the test tanks. Deck lid 61 further includes sink 69. It will be recognized by those skilled in the art that sink 69 is a common feature of vapor hood deck lids and may be appropriate for acids or solvents.

Figure 3:
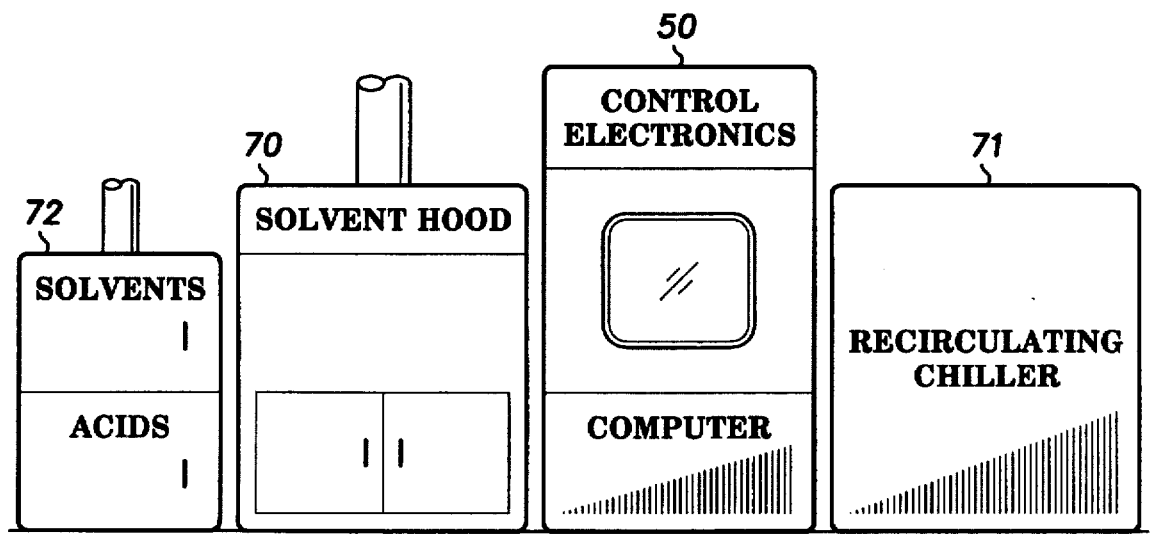
FIG. 3 is a side view representing the overall equipment configuration for an apparatus for testing electronic devices in hostile media.

Turning FIG. 3. FIG. 3, is a side view representing the overall associated equipment configuration for utilizing test apparatus 10. More particularly, FIG. 3 illustrates solvent hood 70 containing deck lid 61 and test apparatus 10. Associated with solvent hood 70 is control electronics and computer 50 arranged in a rack. Control electronics and computer 50 are electrically coupled (via cables not shown) through solvent hood 70 to cable 41 of apparatus 10 (FIG. 1) and to computer controllable pumps and mixing apparatus associated with the manifolded mixing system 63 and intermediate mixing chamber 68 (FIG. 2).

Returning to FIG. 3, recirculating chiller 71 provides heat exchange for isolation tank cooling elements 32 (FIG. 1) as well as test chamber cooling elements 22 (FIG. 1). Furthermore, solvent and acid storage facilities 72 are shown to illustrate that the presently described hostile media test system is extremely safe and self-contained, and therefore need not be isolated from essential components and materials for use during the tests.

It should now be appreciated that an apparatus for testing electronic devices in hostile media has been described which provides significant advantages including permitting the testing of electronic devices in hostile media, allowing for full functional in situ monitoring, and is safe enough to be located in conventional work environments.

We claim:

1. An apparatus for testing a plurality of electronic devices in a hostile medium comprising:

a test tank containing the hostile medium, a sensing portion of each of the plurality of electronic devices exposed to the hostile medium, and a control portion of each of the electronic devices isolated from the hostile medium; and an automated test system electrically operating the plurality of electronic devices during exposure of the sensing portion of the plurality of electronic devices to the hostile medium.

2. The apparatus of claim 1, further comprising a reflux system in the test tank creating reflux of the hostile medium in the test tank.

3. The apparatus of claim 2, wherein the reflux system maintains a constant stoichiometry of the hostile medium.

4. The apparatus of claim 1, wherein the test tank is oxygen free and isolated from external ambient atmospheres during operation of the plurality of electronic devices exposed to the hostile medium.

5. The apparatus of claim 1, further comprising an external isolation tank containing at least a portion of the test tank, the external isolation tank containing an inert material during operation of the plurality of electronic devices exposed to the hostile medium.

6. The apparatus of claim 5, wherein the inert material comprises a fluorinated hydrocarbon liquid filling the external isolation tank to a first level and a relatively inert gas overlying the fluorinated hydrocarbon liquid during operation of the plurality of electronic devices exposed to the hostile medium, and wherein the external isolation tank is oxygen free during operation of the plurality of electronic devices exposed to the hostile medium.

7. An apparatus for testing electronic devices in a hostile medium comprising:

an oxygen free test tank containing the hostile medium and at least portions of the electronic devices;

an oxygen free loading chamber adjacent to the oxygen free test tank and isolated from the oxygen free test tank; and an oxygen free isolation tank containing at least a portion of the oxygen free test tank and at least a portion of the oxygen free loading chamber.

8. The apparatus of claim 7, wherein the oxygen free test tank contains an inert gas and wherein the hostile medium is a liquid in stoichiometric equilibrium.

9. An apparatus for testing electronic devices in a hostile medium having a stoichiometry, the apparatus comprising:

an oxygen free test tank containing the hostile medium and at least a portion of the electronic devices exposed to the hostile medium;

an oxygen free loading chamber adjacent to the test tank and isolated from the oxygen free test tank; and control electronics outside the oxygen free test tank, outside the oxygen free loading chamber, and electrically coupled to the electronic devices during exposure of the electronic devices to the hostile medium.

10. The apparatus of claim 9, further comprising an isolation chamber containing at least a portion of the oxygen free test tank.

11. The apparatus of claim 10, wherein the oxygen test tank comprises a cooling system to maintain the stoichiometry of the hostile medium.

12. An apparatus for testing electronic devices in a hostile medium comprising:

an oxygen free isolation tank;

an oxygen free test tank contained at least partially in the oxygen free isolation tank;

an oxygen free loading chamber adjacent to the oxygen free test tank and at least partially in the oxygen free isolation tank;

at least portions of a plurality of electronic devices within the oxygen free test tank;

a stoichiometrically constant hostile medium in the test tank, at least a portion of one of the plurality of electronic devices exposed to the stoichiometrically constant hostile medium; and a fluorinated hydrocarbon liquid in the oxygen free isolation tank.

13. The apparatus of claim 12, further comprising a plurality of cooling elements in the oxygen free isolation tank and in contact with the oxygen free test tank.

14. The apparatus of claim 12, further comprising a plurality of cooling elements in the oxygen free test tank providing reflux of the stoichiometrically constant hostile medium.

15. The apparatus of claim 12, further comprising an inert gas in the oxygen free isolation tank and in the oxygen free test tank.

16. An apparatus for testing electronic devices in a hostile medium comprising:

an oxygen free isolation tank filled to a first level with fluorinated hydrocarbon liquid, the oxygen free isolation tank including a plurality of gas purge lines that provide a first positive pressure within the oxygen free isolation tank and a plurality of isolation tank cooling elements positioned in the oxygen free isolation tank;

an oxygen free test tank contained at least partially within the oxygen free isolation tank, the oxygen free test tank filled to a second level with the hostile medium, the oxygen free test tank including test tank cooling elements capable of providing reflux of the hostile medium;

a loading chamber adjacent to the oxygen free test tank, the loading chamber having a wall coupling the loading chamber to the oxygen free test tank;

a modular test plate fastened to the wall of the loading chamber, the modular test plate having a test tank side and a loading chamber side; and a plurality of electronic devices coupled to the modular test plate on the loading chamber side, at least portions of the plurality of electronic devices emerging from the test tank side of the modular test plate to be exposed to the hostile medium.

17. The apparatus of claim 16, further comprising a temperature sensor in the oxygen free test tank.

18. The apparatus of claim 16, wherein a second positive pressure is provided in the oxygen free test tank.

19. The apparatus of claim 16, wherein less than all of the plurality of electronic devices are exposed directly to the hostile medium.

* * * * *